United States Patent [19]

Pintchovski et al.

[11] Patent Number: 4,822,753
[45] Date of Patent: Apr. 18, 1989

[54] METHOD FOR MAKING A W/TIN CONTACT

[75] Inventors: Faivel Pintchovski; Philip J. Tobin, both of Austin, Tex.

[73] Assignee: Motorola, Inc., Schaumburg, Ill.

[21] Appl. No.: 191,637

[22] Filed: May 9, 1988

[51] Int. Cl.⁴ .................. H01L 21/283; H01L 21/316
[52] U.S. Cl. .................................. 437/192; 437/201;
437/190; 437/195; 437/246; 437/228; 437/238;
437/200; 357/71; 148/DIG. 20; 148/DIG. 106;
148/DIG. 51
[58] Field of Search ............... 437/192, 179, 245, 246,
437/195, 200, 201, 203, 228, 231, 238, 190;
357/67, 71; 148/DIG. 20, DIG. 106, DIG. 51

[56] References Cited

U.S. PATENT DOCUMENTS

| | | | |
|---|---|---|---|
| 4,141,022 | 2/1979 | Sigg et al. | 357/23 |
| 4,505,030 | 3/1985 | Jeuch | 437/187 |
| 4,518,629 | 5/1985 | Jeuch | 427/89 |
| 4,541,892 | 9/1985 | Jeuch | 156/643 |
| 4,552,783 | 11/1985 | Stoll et al. | 437/187 |
| 4,617,193 | 10/1986 | Wu | 427/38 |
| 4,624,864 | 11/1986 | Hartman | 427/89 |
| 4,666,737 | 5/1987 | Gimpelson et al. | 427/89 |

FOREIGN PATENT DOCUMENTS

| | | | |
|---|---|---|---|
| 0127281 | 5/1984 | European Pat. Off. | |
| 0060582 | 5/1979 | Japan | 437/192 |
| 0098901 | 12/1982 | Japan | |
| 0242018 | 10/1986 | Japan | 437/203 |

OTHER PUBLICATIONS

P. J. Rosser and G. J. Tomkins, *Mat. Res. Soc. Symp. Proc.*, vol. 37, 1985, Materials Research Society, pp. 607–612.

Murarka, S. P., *J. Vac. Sci. Technol.*, 17(4), Jul./Aug. 1980, pp. 775–791.

Smith et al., *V-MIC Conference*, Jun. 9–10, 1986, pp. 403–410.

Primary Examiner—Brian E. Hearn
Assistant Examiner—T. N. Quach
Attorney, Agent, or Firm—John A. Fisher

[57] ABSTRACT

A method is disclosed for fabricating a semiconductor device and especially for contacting a semiconductor device. A silicon substrate is provided which has a device region formed at the surface thereof and which is contacted with a silicide. An insulating layer overlies the substrate and has an opening therethrough which exposes a portion of that device region. Titanium nitride is deposited in a blanket layer overlying the silicide and the insulating layer. A leveling agent such as a spin-on glass is applied to the structure to substantially fill the opening. That leveling agent is then anisotropically etched to leave the leveling agent only in the opening. The leveling agent is used as an etch mask to remove the portion of titanium nitride which is located outside the opening. After removing the remaining leveling agent, the titanium nitride in the opening is used as a nucleating surface for the selective deposition of a tungsten plug which fills the contact opening. The titanium nitride layer serves as both a nucleating surface and as a barrier layer which separates the tungsten from the underlying silicon.

14 Claims, 2 Drawing Sheets

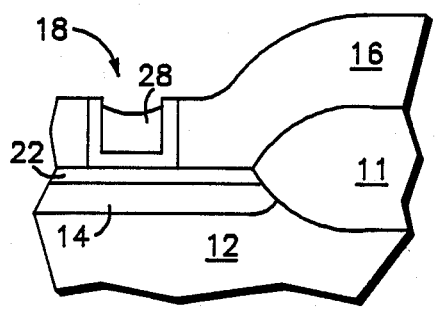
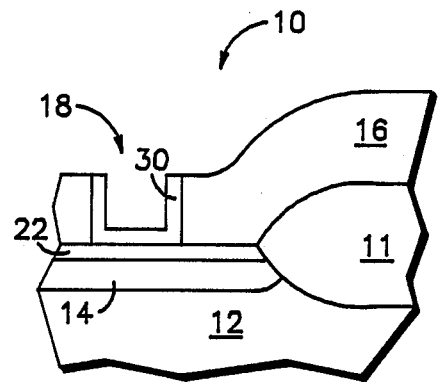
FIG. 5          FIG. 6
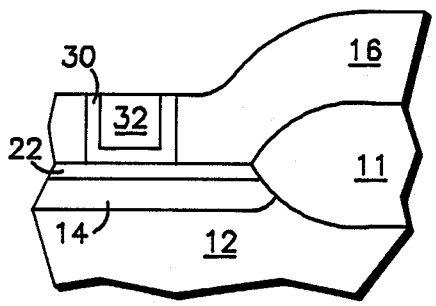
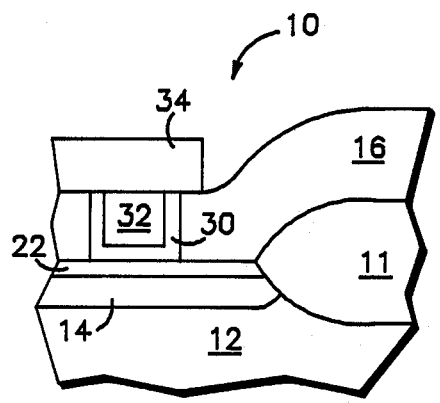
FIG. 7          FIG. 8

METHOD FOR MAKING A W/TIN CONTACT

BACKGROUND OF THE INVENTION

This invention relates generally to a method for contacting a semiconductor device and to a method for the manufacture of a semiconductor device, and more specifically to a method for fabricating semiconductor devices having small contact openings etched through a planarized dielectric to underlying device regions.

As semiconductor devices become more complex, the size of individual device features is reduced. The reduction in feature size causes a number of problems which must be overcome in order to economically produce device with high reliability. One problem which is encountered, for example, is the problem of making reliable electrical contact to device regions so that the device regions may be properly interconnected to implement the desired circuit function.

An integrated circuit generally includes a semiconductor substrate in which a number of device regions are formed by diffusion, ion implantation, or the like. The semiconductor substrate, including the device regions, is overlaid with a thick insulating layer. Openings through this insulating layer allow electrical contact to be made selectively to the underlying device regions. The reduction in feature size requires the contact openings through the insulating layer to be spaced close together, to be of small diameter, and to have steep, nearly vertical, sidewalls. It is difficult, with physically deposited aluminum metallization which is generally used to interconnect the device regions, to fill reliably and reproducibly the small, steep walled openings. The high aspect ratio of insulator thickness to opening diameter makes it difficult to adequately contact the device region exposed at the bottom of the opening. It is also difficult to extend the metal into the opening without having breaks in the metal as it passes over the edge of the opening and traverses into the opening. In addition, the small device structures also are characterized by shallow junctions, and alloying of the aluminum metallization with the underlying silicon substrate often causes spikes which cause shorting of the electrical junction.

Other metals have been used in an attempt to overcome the problems which are attendant with the use of aluminum metallization. The most promising of these alternate techniques appears to be the use of selective tungsten to fill the contact openings and then the subsequent use of aluminum metallization for interconnection. The selective tungsten thus forms a "plug" which fills the contact opening so that the aluminum interconnect metallization is positioned on the top of the relatively planar insulating layer where it can be easily patterned to form the necessarily fine pitched interconnect pattern. The aluminum contacts the top of the plugs and does not have to traverse the step down into the contact openings. The aluminum is also separated from the silicon substrate by the plugs, thus avoiding the problem of junction spiking. The problem with the use of selective tungsten is that the tungsten must be deposited by chemical vapor deposition using tungsten hexafluoride ($WF_6$) as a reactant. Even when the tungsten is deposited by the hydrogen reduction of $WF_6$, however, the initial reaction which takes place is between the $WF_6$ and the silicon substrate. During this reaction with the silicon, a considerable amount of silicon is consumed, resulting in tunnels in the silicon near the junction which impair the reliability of the device.

A need existed, therefore, for an improved process by which contact metallization can be applied to a semiconductor device to achieve reliable and economical contacts without the problems associated with prior art solutions.

It is therefore an object of this invention to provide an improved metallization for a semiconductor device.

It is another object of this invention to provide an improved process for the fabrication of a semiconductor device.

It is yet another object of this invention to provide an improved process for selectively depositing a conductive plug material for use in metallizing a semiconductor device.

BRIEF SUMMARY OF THE INVENTION

The foregoing and other objects and advantages of the invention are achieved through a process which provides a selective and self-aligned barrier in the semiconductor device contact openings. In accordance with one embodiment of the invention, a silicon substrate is provided which has a device region formed at the substrate surface. A silicide region is formed contacting the device region. An insulating layer is formed overlying the substrate and having a contact opening therethrough which exposes a portion of the underlying silicided device region. Over the silicided region is deposited a blanket layer of titanium nitride which also extends over the insulating layer. The titanium nitride is patterned, to remove those portions outside the contact opening without a critical alignment step, by applying a leveling agent such as a spin-on glass over the titanium nitride and substantially filling the opening. The leveling agent and the titanium nitride are anisotropically etched to remove those portions of the leveling agent and titanium nitride which overlay the insulating layer, leaving only the portion of those materials remaining in the opening. The leveling agent is then etched from the opening to expose the remaining portion of the titanium nitride which is self aligned within the contact opening. The remaining titanium nitride is used as a nucleating surface for the selective deposition of tungsten or other contact material to form a conductive plug filling the contact opening. Interconnect metallization such as aluminum is thereafter deposited over the insulating layer and contacting the selective tungsten plug.

BRIEF DESCRIPTION OF THE DRAWINGS

FIGS. 1–8 schematically illustrate, in cross-section, process steps in accordance with one embodiment of the invention for the fabrication of a semiconductor device.

DETAILED DESCRIPTION OF PREFERRED EMBODIMENTS

FIGS. 1–8 illustrate, in cross-section, process steps in accordance with one embodiment of the invention by which a semiconductor device is fabricated. The figures illustrate a portion of a MOS semiconductor device 10; in an actual device the portion illustrated could be repeated many times to implement the particular desired function. Similar illustrative steps would be used to fabricate a bipolar integrated circuit, a complex discrete device, or other semiconductor device, but the other devices might differ in starting structure or other details not related to or necessary for the practice of the invention.

Figure 1:
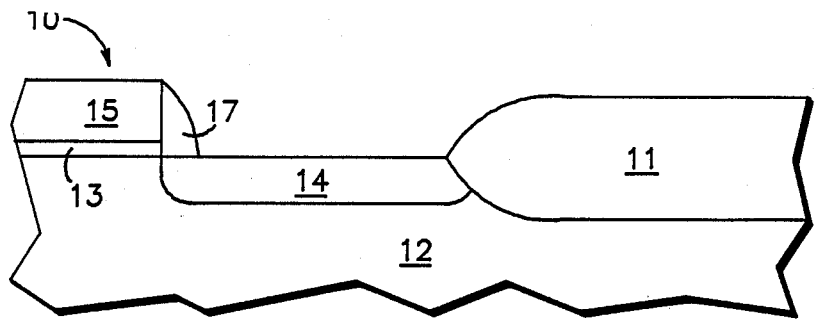

FIG. 1 illustrates a portion of device 10 at an intermediate stage in its manufacture. Device 10 includes a semiconductor substrate 12 which is preferably a silicon substrate. Device region 14 is formed in substrate 12 by diffusion, ion implantation, or the like. Device region 14 is formed near the surface of substrate 12 and has a portion intersecting that surface. A thick field oxide 11 divides the surface of substrate 12 into a plurality of active regions. The active region illustrated includes, in addition to device region 14, a polycrystalline silicon gate electrode 15 overlying gate insulator 13. A spacer 17 has been formed at the edge of the gate structure.

In accordance with the invention, a first step in a preferred process for contacting device region 14 is to form a silicide region 22 on the surface of device region 14. In addition, the silicide is formed on the surface of gate electrode 15 and on any other exposed silicon. Silicide region 22 is preferably titanium silicide, cobalt silicide, or other silicide having the properties of low resistivity and low contact resistance. Titanium silicide is formed by sputtering a layer of titanium having a thickness of 10–75 nanometers in a blanket layer overlying the structure and contacting device region 14. The titanium layer is annealed at a temperature of about 650° C. for about 15–60 seconds in a nitrogen containing ambient such as nitrogen gas or ammonia, or alternatively in an argon ambient or in vacuum. The anneal, which is preferably done by rapid thermal annealing (RTA), causes the titanium to react with the silicon at the surface of device region 14 to form titanium silicide region 22. Annealng in nitrogen also causes the formation of a thin layer of titanium nitride at the exposed surface of the titanium, but this is a thin and imperfect layer of titanium nitride which does not form a reliable diffusion barrier. The remaining unreacted titanium and the thin layer of titanium nitride are removed from insulator 16 by etching in a solution of ammonium hydroxide and hydrogen peroxide. The etchant removes titanium and titanium nitride without etching the titanium silicide. The titanium silicide is thus formed in a self-aligned manner on any silicon which was exposed during the sputter deposition of the titanium. The titanium silicide is further annealed at 800°–900° C. for 15–45 seconds to insure the formation of stoichiometric $TiSi_2$.

Figure 2:
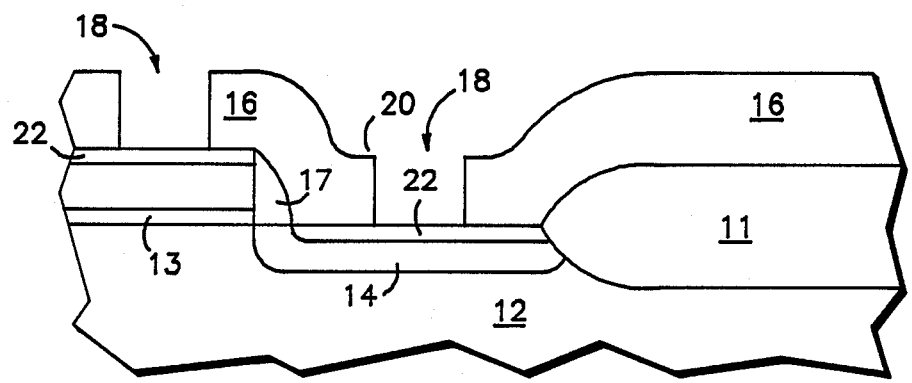

The process continues, as illustrated in FIG. 2, with the formation of a thick insulating layer 16, for example by low pressure chemical vapor deposition (LPCVD). Insulating layer 16 overlies the surface of substrate 12 and includes an opening 18 which exposes a portion of the silicided device region 22. A similar opening through insulator 16 exposes a portion of silicided gate electrode 15. Insulating layer 16 is an oxide, nitride, glass, or the like, and may have a thickness of several hundred nanometers to several micrometers. Contact opening 18 is preferably formed by etching, with the size and shape of the opening being defined by a standard photolithographic process. In a high density integrated circuit structure, for example, opening 18 may have a diameter of one micrometer or less and preferable has relatively steep, vertical walls. The vertical walls maximize the size of the opening at the device region for a given opening at the top of the insulator.

The thickness of insulating layer 16 together with the small size and vertical side walls of opening 18 make it difficult to reliably and reproducibly contact device region 14. It is difficult to fill the deep narrow opening with metal and it is difficult to cover the steep corner 20 without a crack or void in the metal at that location.

Figure 3:
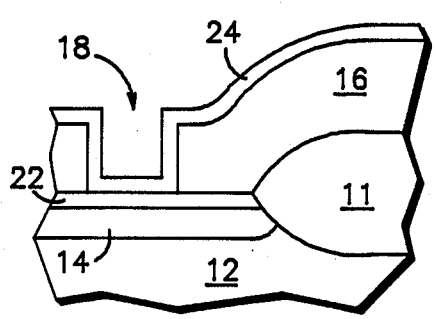

The process is continued, as illustrated in FIG. 3, by the deposition of a blanket layer of titanium nitride 24 over insulating layer 16, into opening 18, and in contact with silicided region 22. For clarity, this is illustrated only for the contact to device region 14. It is preferred that titanium nitride layer 24 be formed by chemical vapor deposition (CVD), and especially by LPCVD, because such a deposition is nearly conformal. The layer can also be formed by sputtering from a titanium nitride target or by sputtering titanium and then converting the titanium to titanium nitride by annealing in a nitrogen containing ambient. Sputter deposition, however, is not as conformal as is the LPCVD so that the titanium nitride layer is not uniform over insulator 16, silicide region 22, and the sidewalls of opening 18. The titanium nitride layer is a barrier layer. It must be electrically conductive, form a barrier to the diffusion of silicon, and form a nucleating layer for a selective deposition to be done later in the process.

Figure 4:
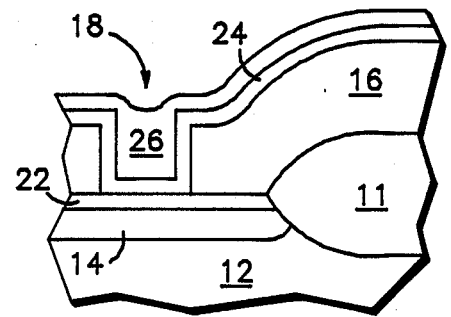

In accordance with the invention, it is necessary to remove barrier layer 24 from all regions in which a selective deposition is not desired. This requires a self-aligning technique for masking the barrier layer in opening 18 and exposing it elsewhere. As illustrated in FIG. 4, this is accomplished by applying a leveling agent 26 to the structure. The leveling agent is a spin on glass, photoresist, polyimide, of the like which is applied in a liquid form, for example by spinning. The liquid material fills opening 18 with a relatively thick amount of material in comparison to the lesser amount of material which is left overlying the relatively flat upper surface of insulator 16.

Leveling agent 26, which may first require a heat treatment step, for example to drive off volatile components, is anisotropically etched to remove the thinner portions which overlie insulator 16, leaving a mask 28 located in opening 18. As illustrated in FIG. 5, mask 28 is then used as an etch mask to remove those portions of barrier layer 24 which are located outside opening 18. If the leveling agent is spin-on glass, the spin-on glass can be anisotropically etched by reactive ion etching. The titanium nitride is wet etched in a solution of sulfuric acid/hydrogen peroxide or other selective etchant, or can be dry etched by reactive ion etching.

Following the masked etching of barrier layer 24, which form the self-aligned barrier layer and nucleating surface 30, the leveling agent is removed by isotropic etching. If the leveling agent is spin-on glass, it is quickly and easily etched in a dilute solution of hydrofluoric acid. If the leveling agent is photoresist or polyimid, it is easily removed in a solvent spray. The structure resulting after the isotropic etching of the leveling agent is illustrated in FIG. 6. Device region 14 is contacted by a silicide region 22. The silicide region 22, in turn, is contacted by a conductive barrier layer and nucleating layer 30 which is localized in extent and covers the bottom and sidewalls of opening 18.

As illustrated in FIG. 7, tungsten or other conductive refractory material is next deposited selectively on the nucleating layer 30 to a thickness sufficient to fill opening 18 with a conductive plug 32. Selective tungsten is deposited by chemical vapor deposition, for example, by the hydrogen reduction of $WF_6$. The selective tungsten deposition requires a silicon or metallic surface as a catalyst to the deposition process. The patterned titanium nitride layer 30 serves as such a catalyst. No tungsten is deposited on insulating layer 16 because of the selective nature of the deposition. Barrier layer 30, besides acting as a nucleating site, also forms a barrier, preventing the interdiffusion of silicon from device region 14 and tungsten from the plug, and avoids silicon consumption in the reaction with the $WF_6$.

The structure is completed, as illustrated in FIG. 8, by the application and patterning of a layer of interconnect metallization 34. Interconnect metallization 34 is preferably aluminum or an aluminum alloy. The aluminum is easily applied by sputtering and is readily patterned to form the required pattern of interconnect metallization contacting and connecting various device regions and connecting device regions to bonding pads for subsequent interconnection to a device package. Metallization for device 10 thus includes a silicided region 22 contacting device region 14, a barrier layer 30, a selective tungsten plug 32, and patterned aluminum 34 contacting the tungsten plug and interconnecting various device regions.

Thus it is apparent that there has been provided, in accordance with the invention, a method for contacting a semiconductor device which fully meets the objects and advantages set forth above. Although the invention has been described and illustrated with reference to specific embodiments thereof, is not intended to be limited to these illustrative embodiments. Those skilled in the art will recognize that variations and modifications can be made in the process without departing from the spirit of the invention. For example, those skilled in the art will recognize that other techniques are available for performing the etching steps, and other metals are available as barrier layers, plug materials, and interconnect metallization. Further, the silicided region may be formed after the insulating layer and opening have been provided. Accordingly, it is intended to include within the invention all those variations and modifications as fall within the scope of the appended claims.

What is claimed is:

1. A method for contacting a semiconductor device comprising the steps of: providing a silicon substrate having a device region formed at the surface thereof; forming a silicide region contacting said device region; forming an insulating layer overlying said substrate and having an opening therethrough; depositing titanium nitride in a blanket layer overlying said silicide and said insulating layer; applying a leveling agent overlying said titanium nitride and substantially filling said opening; etching said leveling agent to expose said titanium nitride overlying said insulating layer; etching said titanium nitride overlying said insulating layer to leave a portion of said titanium nitride and said leveling agent remaining in said opening; removing the remaining portion of said leveling agent to expose the remaining portion of said titanium nitride; and selectively depositing tungsten onto said remaining portion of said titanium nitride.

2. The method of claim 1 wherein said silicide region comprises a silicide selected from titanium silicide and cobalt silicide.

3. The method of claim 1 wherein said leveling agent comprises a material selected from spin on glass, polyimide, and photoresist.

4. The method of claim 1 wherein said step of etching said leveling agent comprises anisotropic etching.

5. The method of claim 1 wherein said step of removing the remaining portion comprises etching in an isotropic etchant.

6. The method of claim 1 further comprising the step of forming a patterned layer of aluminum overlying said insulating layer and contacting said selectively deposited tungsten.

7. A method for contacting a semiconductor device comprising the steps of: providing a semiconductor substrate having a device region formed therein and having a portion thereof intersecting a surface of said semiconductor substrate; forming an insulating layer overlying said substrate and having an opening therethrough exposing said portion of said device region; depositing an electrically conductive barrier layer overlying said insulating layer, extending into said opening, and electrically contacting said portion of said device region; applying a leveling agent overlying said barrier layer and substantially filling said opening; partially etching said leveling agent to remove those portions overlying said insulating layer; etching said barrier layer overlying said insulating layer and to leave said leveling agent and said barrier layer in said opening; removing the remaining portion of said leveling agent to expose the remaining portion of said barrier layer; selectively depositing a conductor material onto said remaining portion of said barrier layer; and forming a patterned interconnection layer overlying said insulating layer and contacting said conductor material.

8. The method of claim 7 wherein said step of depositing an electrically conductive barrier layer comprises chemical vapor depositing a layer of titanium nitride.

9. The method of claim 7 further comprising the step of forming a silicide region contacting said portion of said device region and providing electrical contact between said device region and said barrier layer.

10. The method of claim 9 wherein said step of forming a silicide region comprises the steps of: forming a layer of titanium in contact with said portion of said device region; and heating said layer of titanium.

11. The method of claim 9 wherein said step of forming a silicide region comprises the steps of: forming a layer of cobalt in contact with said portion of said device region; and heating said layer of cobalt.

12. The method of claim 7 wherein said step of applying a leveling agent comprises the steps of: applying a material from the group consisting of spin on glass, polyimide, and photoresist; and heating said material.

13. A method for fabricating a semiconductor device comprising the steps of: providing a silicon substrate having a device region formed therein at a surface thereof; forming a titanium silicide region contacting said device region; forming an insulating layer overlying said substrate and having an opening therethrough exposing said device region; depositing a layer of titanium nitride overlying said insulating layer and extending into said opening to contact said titanium silicide region; applying a spin on glass layer overlying said titanium nitride layer and substantially filling said opening; anisotropically etching said spin on glass layer to remove a first portion of same from said insulating layer and to leave a second portion of same in said opening; etching that portion of said titanium nitride not covered by said second portion of said spin on glass to leave a second portion of titanium nitride in said opening; etching said second portion of said spin on glass layer to expose said second portion of said titanium nitride; selectively depositing tungsten onto said second portion of said titanium nitride layer; and forming a patterned layer comprising aluminum overlying said insulating layer and contacting said tungsten.

14. The method of claim 13 wherein said step of forming a titanium silicide region comprises the steps of: sputter depositing a layer of titanium to contact said device region; heating said layer of titanium to react said titanium and said silicon to form titanium silicide; and etching off the remaining portion of said layer of titanium.

* * * * *